United States Patent
Deak

(10) Patent No.: US 9,891,292 B2
(45) Date of Patent: Feb. 13, 2018

(54) MONOLITHIC THREE-AXIS LINEAR MAGNETIC SENSOR AND MANUFACTURING METHOD THEREOF

(71) Applicant: MultiDimension Technology Co., Ltd., Zhangjiagang (CN)

(72) Inventor: James Geza Deak, Zhangjiagang (CN)

(73) Assignee: MultiDimension Technology Co., Ltd., Zhangjiagang (CN)

(*) Notice: Subject to any disclaimer, the term of this patent is extended or adjusted under 35 U.S.C. 154(b) by 0 days.

(21) Appl. No.: 15/304,770

(22) PCT Filed: Apr. 14, 2015

(86) PCT No.: PCT/CN2015/076517
§ 371 (c)(1),
(2) Date: Oct. 17, 2016

(87) PCT Pub. No.: WO2015/158243
PCT Pub. Date: Oct. 22, 2015

(65) Prior Publication Data
US 2017/0123016 A1    May 4, 2017

(30) Foreign Application Priority Data

Apr. 17, 2014   (CN) .......................... 2014 1 0155003

(51) Int. Cl.
*G01R 33/09* (2006.01)
*G01R 33/02* (2006.01)
(Continued)

(52) U.S. Cl.
CPC ...... *G01R 33/0206* (2013.01); *G01R 33/0011* (2013.01); *G01R 33/0052* (2013.01); *G01R 33/09* (2013.01); *H01L 28/20* (2013.01)

(58) Field of Classification Search
CPC ................................ G01R 33/09; H01L 28/20
(Continued)

(56) References Cited

U.S. PATENT DOCUMENTS

| 2013/0334634 | A1* | 12/2013 | Deak ......................... G01B 7/30 257/427 |
| 2015/0008913 | A1* | 1/2015 | Fu .......................... G01R 33/096 324/252 |
| 2016/0223623 | A1* | 8/2016 | Deak ....................... G01R 33/09 |

FOREIGN PATENT DOCUMENTS

| CN | 101969098 | | 2/2011 |
| CN | 102385043 | A | 3/2012 |

(Continued)

OTHER PUBLICATIONS

"International Application No. PCT/CN2015/076517, International Search Report and Written Opinion dated May 29, 2015", (May 29, 2015), 13 pgs.

*Primary Examiner* — Reena Aurora
(74) *Attorney, Agent, or Firm* — Schwegman Lundberg & Woessner, P.A.

(57) ABSTRACT

A monolithic three-axis linear magnetic sensor and manufacturing method wherein the sensor comprises an X-axis sensor, a Y-axis sensor and a Z-axis sensor. The X-axis sensor comprises a referenced bridge and at least two X ferromagnetic flux guides. The Y-axis sensor comprises a push-pull bridge and at least two Y ferromagnetic flux guides. The Z-axis sensor comprises a push-pull bridge and at least one Z ferromagnetic flux guide. The bridge arms of the referenced bridge and push-pull bridge are each formed by one or more magnetoresistive elements that are electrically interconnected. The directions of the sensing axes and the directions of magnetization of the pinned layers of the magnetoresistive elements are all oriented along the X-axis. This manufacturing method comprises first depositing a magnetoresistive thin film on a wafer, and then performing several processes such as magnetic annealing, photolithography, etching, coating, and the like in order to realize a sensor. This monolithic three-axis linear magnetic sensor (Continued)

has the advantages of low cost, easy manufacturability, good linearity, and high sensitivity.

24 Claims, 13 Drawing Sheets

(51) Int. Cl.
*G01R 33/00* (2006.01)
*H01L 49/02* (2006.01)

(58) Field of Classification Search
USPC .......................................................... 324/252
See application file for complete search history.

(56) References Cited

FOREIGN PATENT DOCUMENTS

| | | |
|---|---|---|
| CN | 102426344 A | 4/2012 |
| CN | 202548308 | 11/2012 |
| CN | 102918413 | 2/2013 |
| CN | 103267520 | 8/2013 |
| CN | 203480009 | 3/2014 |
| CN | 103913709 | 7/2014 |
| CN | 103954920 | 7/2014 |
| CN | 203811786 | 9/2014 |
| CN | 203811787 | 9/2014 |
| EP | 2267470 | 12/2010 |
| JP | S59197874 | 11/1984 |
| WO | WO-2015/158243 | 10/2015 |

\* cited by examiner

MONOLITHIC THREE-AXIS LINEAR MAGNETIC SENSOR AND MANUFACTURING METHOD THEREOF

PRIORITY CLAIM TO RELATED APPLICATIONS

This application is a U.S. national stage application filed under 35 U.S.C. § 371 from International Application Serial No. PCT/CN2015/076517, which was filed 14 Apr. 2015, and published as WO2015/158243 on 22 Oct. 2015, and which claims priority to Chinese Application No. 201410155003.2, filed 17 Apr. 2014, which applications and publication are incorporated by reference as if reproduced herein and made a part hereof in their entirety, and the benefit of priority of each of which is claimed herein.

TECHNICAL FIELD

The present invention relates to a linear magnetic sensor, and in particular, to a monolithic three-axis linear magnetic sensor and a manufacturing method thereof.

BACKGROUND ART

With the development of magnetic sensor technologies, magnetic sensors have developed from early single-axis magnetic sensors to later double-axis magnetic sensors and then to current three-axis magnetic sensors, such that they can detect magnetic field signals in three directions X, Y and Z simultaneously.

For magnetic sensors such as AMR, GMR and TMR, a magnetic field sensing direction is in a plane of the thin film material, and measurement of X-axis and Y-axis magnetic field components in the plane may be implemented by making two sensors orthogonal, thereby implementing an XY two-axis magnetic field sensor system. However, for a Z-axis magnetic field component, the usual solution is building a discrete tilted single-axis plane magnetic sensor on a two-axis plane sensor, for example, the three-axis magnetic field sensor disclosed in the patent with Application No. 201110251902.9 and entitled "Three-Axis Magnetic Field Sensor". However, this method has the following defects:

1) The X, Y two-axis magnetic sensor and the Z single-axis magnetic sensor are discrete elements before mounting, so that integrated manufacture of the three-axis magnetic sensor cannot be implemented, thereby increasing the complexity of the manufacturing process.

2) Compared to an integrated manufacturing method, positional precision of the elements of a three-axis magnetic sensor manufactured by assembling discrete elements are reduced, thus degrading the measurement precision of the sensor.

3) The sensing axis of the Z single-axis magnetic sensor is perpendicular to the X, Y two-axis magnetic sensor plane, and therefore, the dimension of the three-axis magnetic sensor in the Z direction is increased, thereby increasing the device size and the difficulty in packaging.

Another solution is using a slope to set a magnetic sensor unit to detect a magnetic signal in the Z direction, as disclosed in the patent CN202548308U entitled "Three-Axis Magnetic Sensor". However, the slope angle in the sensor in this structure is hard to control, and shadowing effects are easily caused in the process of depositing a magnetoresistive thin film on the slope, thereby reducing the performance of a magnetic sensor element. Moreover, an algorithm is needed to calculate a magnetic signal in the Z-axis direction.

Another solution is a solution disclosed in the patent application 201310202801.1 entitled "A Three-Axis Digital Compass", which converts a Z-axis magnetic field component perpendicular to a plane into a magnetic field component in an XY plane by using a distortion of the magnetic field by a flux concentrator, thereby implementing measurement on a magnetic signal in a Z-axis direction. However, the magnetic sensor of this structure needs an ASIC chip or computation using an algorithm to obtain magnetic signals in three X, Y and Z directions.

Currently, a three-axis magnetic sensor is manufactured mainly by methods such as etching a layer of a substrate to form a slope, depositing a magnetoresistive material thin film on the slope, and double deposition of the sensor material, for example, the manufacturing process of a sensor disclosed in the patent CN202548308U entitled "Three-Axis Magnetic Sensor" substantially includes etching a substrate layer of a wafer to form two slopes, double-depositing a magnetoresistive material thin film on the two slopes respectively, and conducting double annealing to manufacture sensor units for measuring in an XZ direction and a YZ direction. The European Patent Application EP 2267470 B1 also discloses a method for manufacturing a three-axis sensor, in which a substrate is etched to form a slope, and a sensor unit for measuring a magnetic field component in a Z-axis direction is manufactured on the slope. The angles of the etched slopes in the two implementations are hard to control, and there is a difficulty in depositing the magnetoresistive material thin film on the slope, which are not conducive to actual implementation. In addition, the patent application CN102918413A of the EVERSPIN TECHNOLOGIES INC. entitled "Process Integration of a Single Chip Three Axis Magnetic Field Sensor" also discloses a method for integrating a three-axis magnetic field, the method including: etching a first and a second plurality of trenches within a first dielectric layer, each trench of the first and second plurality of trenches having a bottom and a side; depositing a first material on at least the side of each of the first plurality of trenches, the first material having a high magnetic permeability; depositing a second material in the first plurality of trenches and depositing a third conductive material in the second plurality of trenches; depositing a second dielectric layer over the first dielectric layer and the first and second plurality of trenches; forming a first plurality of conductive channels passing through the second dielectric layer to the third material in a first portion of the second trenches; forming a first plurality of thin-film magnetoresistive magnetic field sensor elements on the second dielectric layer positioned adjacent to the sides of the first plurality of trenches, each one of the first plurality of thin-film magnetoresistive magnetic field sensor elements being electrically coupled to one of the first plurality of channels; and depositing a third dielectric layer over the second dielectric layer and the first plurality of thin-film magnetoresistive magnetic field sensor elements. This method is relatively complicated, and the operating process is not easy to control. In the prior art, the three-axis magnetic sensor may also be formed by using a flux concentrator, but magnetization directions of the pinned layers of its magnetoresistive elements are not aligned in the same direction rendering the implementation relatively difficult.

SUMMARY OF THE INVENTION

In order to solve the above problems, the present invention proposes a monolithic three-axis linear magnetic sensor and a manufacturing method thereof. The monolithic three-axis linear magnetic sensor can directly output magnetic signals from three X, Y, and Z sensing directions. Therefore, it is unnecessary to use an algorithm for computation. In addition, during the manufacturing process, it is unnecessary to etch a groove or to form a slope, double deposition is not needed either, and directions of pinned layers of the magnetoresistive sensing elements in the X-axis sensor, the Y-axis sensor and the Z-axis sensor are the same and are all oriented along the X-axis direction.

A monolithic three-axis linear magnetic sensor provided in the present invention includes:

a substrate in an XY plane, the substrate having an X-axis sensor, a Y-axis sensor and a Z-axis sensor integrated thereon, each of which includes one or more identical magnetoresistive sensing elements that are electrically interconnected, for detecting components of a magnetic field in an X-axis direction, a Y-axis direction and a Z-axis direction, respectively;

the X-axis sensor including a referenced bridge and at least two X ferromagnetic flux guides, a reference arm and a sensing arm of the referenced bridge being arranged alternately and each including the one or more identical magnetoresistive sensing elements that are electrically interconnected; the magnetoresistive sensing elements on the reference arm being placed above or beneath the X ferromagnetic flux guides, and being arranged along length directions of the X ferromagnetic flux guides to form reference element series;

the magnetoresistive sensing elements on the sensing arm being placed at gaps between the adjacent two of the X ferromagnetic flux guides, and being arranged along the length directions of the X ferromagnetic flux guides to form sensing element series;

the Y-axis sensor including a push-pull bridge, a push arm and a pull arm of the push-pull bridge each being correspondingly provided thereon with at least two Y ferromagnetic flux guides, the push arm and the pull arm being arranged alternately and each including the one or more identical magnetoresistive sensing elements that are electrically interconnected, and the magnetoresistive sensing elements being placed at gaps between the respective adjacent two of the Y ferromagnetic flux guides;

the Z-axis sensor including a push-pull bridge and at least one Z ferromagnetic flux guide, a push arm and a pull arm of the push-pull bridge being arranged alternately and each including the one or more identical magnetoresistive sensing elements that are electrically interconnected; the magnetoresistive sensing elements on the push arm and the pull arm being placed at two sides of the bottom or the top of the Z ferromagnetic flux guide, respectively, and being arranged along the length direction of the Z ferromagnetic flux guide;

magnetization directions of pinned layers of all the magnetoresistive sensing elements in the X-axis sensor, the Y-axis sensor and the Z-axis sensor being all the same, and when there is no ferromagnetic flux guide, sensing directions of all the magnetoresistive sensing elements being the X-axis direction;

wherein the X axis, the Y axis and the Z axis are pairwise orthogonal to each other.

Preferably, the magnetoresistive sensing elements are GMR spin valve elements or TMR sensing elements.

Preferably, the X ferromagnetic flux guides, the Y ferromagnetic flux guides and the Z ferromagnetic flux guide are all an array of rectangular strips, and are all made of a soft ferromagnetic alloy.

Preferably, each one of the reference element series is spaced from the adjacent one of the sensing element series by an interval L; when the number of the X ferromagnetic flux guides is an even number, two of the reference element series are adjacent to each other in the middle of the X-axis sensor, and the interval thereof is 2L; when the number of the X ferromagnetic flux guides is an odd number, two of the sensing element series are adjacent to each other in the middle of the X-axis sensor, and the interval thereof is 2L, wherein L is a natural number.

Preferably, gain coefficients of magnetic fields at gaps between the X ferromagnetic flux guides are 1<Asns<100, and attenuation coefficients of magnetic fields above or beneath the X ferromagnetic flux guides are 0<Aref<1.

Preferably, for the Y-axis sensor, the numbers of the Y ferromagnetic flux guides on the push arm and the pull arm are the same; an angle α between the Y ferromagnetic flux guide on the push arm and the positive direction of the X axis is 0° to 90°, and an angle β between the Y ferromagnetic flux guide on the pull arm and the positive direction of the X axis is −90° to 0°; or an angle α between the Y ferromagnetic flux guide on the push arm and the positive direction of the X axis is −90° to 0°, and an angle β between the Y ferromagnetic flux guide on the pull arm and the positive direction of the X axis is 0° to 90°, wherein |α|=|β|.

Preferably, for the Y-axis sensor, the numbers of the magnetoresistive sensing elements on the push arm and the pull arm are the same and the magnetoresistive sensing elements in opposite positions are parallel to each other; rotation angles of the magnetoresistive sensing elements on the push arm and the pull arm are at the same amplitude but in different directions.

Preferably, for the Z-axis sensor, the numbers of the magnetoresistive sensing elements on the push arm and the pull arm of the push-pull bridge are the same.

Preferably, the ratio between the length and the width of the magnetoresistive sensing elements of the Z-axis sensor is greater than 1.

Preferably, a gap S between the adjacent two of the Z ferromagnetic flux guides is not less than the width Lx of the Z ferromagnetic flux guide.

Preferably, the gap S between the adjacent two of the Z ferromagnetic flux guides is greater than 2Lx.

Preferably, the magnetoresistive sensing elements in the Z-axis sensor are located on outer sides of edges at two sides of the top or the bottom of the Z ferromagnetic flux guide.

Preferably, the sensitivity of the Z-axis sensor can be increased by reducing the gap between the magnetoresistive sensing elements in the Z-axis sensor and the edge of the bottom of the Z ferromagnetic flux guide or increasing the thickness Lz of the Z ferromagnetic flux guide or reducing the width Lx of the Z ferromagnetic flux guide.

Preferably, when there is no external magnetic field, the magnetoresistive sensing elements achieve the magnetization direction of the magnetic free layer perpendicular to that of the pinned layer by permanent magnet bias, double-exchange interaction, shape anisotropy or any combination thereof Preferably, the referenced bridge and the push-pull bridge are both of a half-bridge, full-bridge or quasi-bridge structure.

Preferably, the substrate is integrated with an ASIC chip thereon, or the substrate is electrically connected to a separate ASIC chip.

Preferably, semiconductor packaging of the monolithic three-axis linear magnetic sensor includes wire bonding of bonding pads, flip-chip, ball grid array (BGA), wafer level package (WLP) or chip on board (COB).

Preferably, the X-axis sensor, the Y-axis sensor and the Z-axis sensor have the same sensitivity.

The present invention further provides a method for manufacturing a monolithic three-axis linear magnetic sensor, the method including the following steps:

(1) depositing a magnetoresistive material thin film stack on a wafer, and setting magnetization direction of a pinned layer, magnetic properties of the pinned layer, magnetic properties of a free layer and electrical properties of a tunnel junction in the magnetoresistive material thin film stack by thermal annealing in a magnetic field;

(2) constructing a bottom electrode, and constructing magnetoresistive sensing elements in an X-axis sensor, a Y-axis sensor and a Z-axis sensor on the magnetoresistive material thin film stack at the same time;

(3) depositing an insulation layer I above the magnetoresistive sensing elements, and forming, on the insulation layer I, a via that provides an electrical connection channel for the magnetoresistive sensing elements;

(4) depositing a top metal layer above the via, constructing the top metal layer into a top electrode, and conducting wiring between the elements;

(5) depositing an insulation layer II above the top metal layer, then depositing a soft ferromagnetic alloy material layer above the insulation layer II, and constructing an X ferromagnetic flux guide, a Y ferromagnetic flux guide and a Z ferromagnetic flux guide on the soft ferromagnetic alloy material layer at the same time; and (6) depositing a passivation layer above all the X ferromagnetic flux guide, the Y ferromagnetic flux guide and the Z ferromagnetic flux guide at the same time, etching the passivation layer and opening vias at positions corresponding to the bottom electrode and the top electrode, and forming a bonding pad connected externally.

Preferably, inthe magnetoresistive material thin film stack, the pinned layer is pinned by using an antiferromagnetic material having a blocking temperature of TB1, and the free layer is biased by using a second antiferromagnetic material having a blocking temperature of TB2, wherein TB1>TB2; the thermal annealing conducted in the magnetic field is two-step thermomagnetic annealing, including the following steps: first annealing the wafer in a magnetic field having a temperature of T1, wherein T1>TB1; next cooling in a magnetic field having a temperature of T2, wherein TB1>T2>TB2; after the temperature of the wafer is cooled down to T2, rotating the direction of the wafer or an external magnetic field by 90 degrees; then cooling the wafer to a temperature T3, and removing the external magnetic field, wherein TB2>T3; and finally cooling the wafer to the normal temperature.

Preferably, in step (2), the magnetoresistive sensing elements in the X-axis sensor, the Y-axis sensor and the Z-axis sensor are constructed on the magnetoresistive material thin film stack at the same time by lithography, ion etching, reaction ion etching, wet etching, lift off or hard masking.

Preferably, in step (3), the via is formed by lithography, ion etching, reaction ion etching or wet etching.

Preferably, the via in step (3) is a self-aligned contact hole which is formed by a lift off process or a hard masking process.

Preferably, the depositing an insulation layer II above the top metal layer includes: depositing a first insulation sub-layer above the top metal layer; depositing a conductor for constructing an electromagnetic coil on the first insulation sub-layer; and depositing a second insulation sub-layer on the electromagnetic coil, the first insulation sub-layer, the second insulation sub-layer and the conductor forming the insulation layer II; and the depositing a soft ferromagnetic alloy material layer above the insulation layer II includes: depositing the soft ferromagnetic alloy material layer on the second insulation sub-layer.

BRIEF DESCRIPTION OF DRAWINGS

To describe the technical solutions in the technologies in embodiments of the present invention more clearly, accompanying drawings that need to be used in the technologies in the embodiments are introduced briefly. Apparently, the accompanying drawings described in the following are only some embodiments of the present invention, and those of ordinary skill in the art can further obtain other accompanying drawings according to the accompanying drawings without any creative effort.

DETAILED DESCRIPTION OF THE PREFERRED EMBODIMENTS

The present invention will be described in detail below with reference to the accompanying drawings and in combination with embodiments.

Embodiment 1

Figure 1:
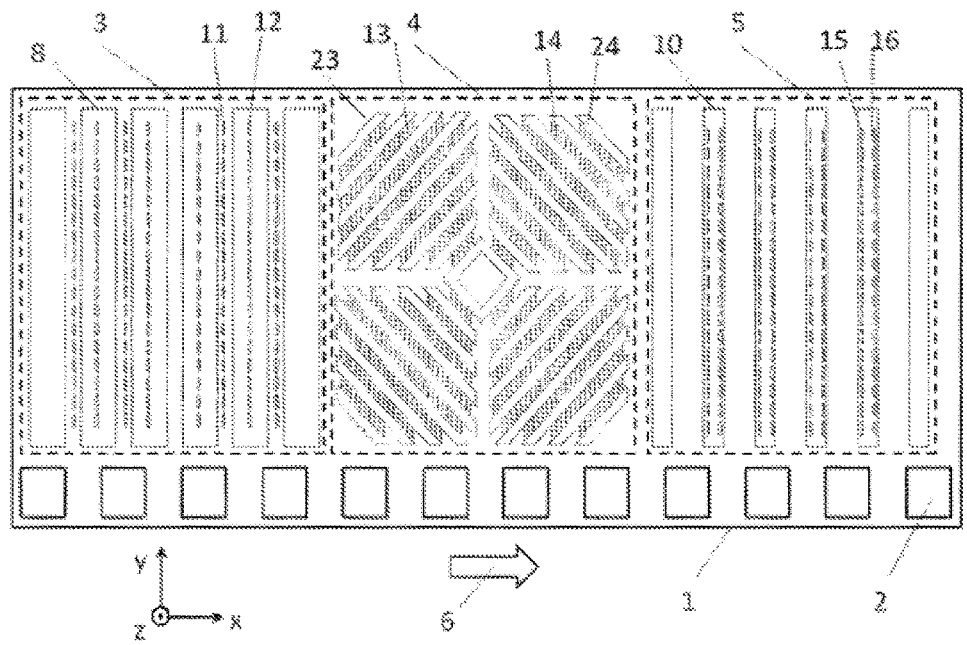
FIG. 1 is a schematic structural diagram of a monolithic three-axis linear magnetic sensor in the present invention.

FIG. 1 is a schematic structural diagram of a monolithic three-axis linear magnetic sensor in the present invention in an XY plane. The sensor includes a substrate 1, and the substrate 1 is integrated thereon with an X-axis sensor 3, a Y-axis sensor 4, a Z-axis sensor 5 and a plurality of bonding pads 2 for input and output. The X-axis sensor 3 includes sensing element series 11, reference element series 12 and X ferromagnetic flux guides 8, wherein the reference element series 12 are placed beneath the X ferromagnetic flux guides 8, and the sensing element series 11 are placed at a gap between the adjacent two of the X ferromagnetic flux guides 8. The sensing element series 11 and the reference element series 12 are each formed by electrically connecting one or more identical magnetoresistive sensing elements. The Y-axis sensor 4 includes Y ferromagnetic flux guides 23, 24 and magnetoresistive sensing elements 13, 14, wherein the magnetoresistive sensing elements 13 are arranged in columns at a gap between the adjacent two of the Y ferromagnetic flux guides 23, and the magnetoresistive sensing elements 14 are arranged in columns at a gap between the adjacent two of the Y ferromagnetic flux guides 24, wherein the number of the magnetoresistive sensing elements 13 and the number of the magnetoresistive sensing elements 14 are the same, the number of the Y ferromagnetic flux guides 23 and the number of the Y ferromagnetic flux guides 24 are also the same, the Y ferromagnetic flux guide 23 forms a positive angle with the positive direction of the X axis, and the Y ferromagnetic flux guide 24 forms a negative angle with the positive direction of the X axis, preferably, absolute values of the two angles are the same. In addition, the Y ferromagnetic flux guide 23 may also form a negative angle with the positive direction of the X axis, while the Y ferromagnetic flux guide 24 forms a positive angle with the positive direction of the X axis. The Z-axis sensor includes a Z ferromagnetic flux guide 10 and magnetoresistive sensing elements 15, 16, wherein the magnetoresistive sensing elements 15, 16 are electrically connected in columns at two sides of the bottom of the Z ferromagnetic flux guide 10, respectively. In addition, the magnetoresistive sensing elements forming the reference element series 12 in the X-axis sensor may also be placed above the X ferromagnetic flux guides 8. At this point, the magnetoresistive sensing elements 15, 16 in the Z-axis sensor are placed at two sides of the top of the Z ferromagnetic flux guide 10.

All the magnetoresistive sensing elements are GMR spin valves or TMR sensing elements, and may be, but not limited to, square-shaped, rhombic-shaped, or oval-shaped. Magnetization directions 6 of pinned layers of all the magnetoresistive sensing elements are the same, and are all oriented along the X-axis. When there is no external magnetic field, the magnetoresistive sensing elements achieve magnetization direction of the magnetic free layer perpendicular to that of the pinned layer by permanent magnet bias, double-exchange interaction, shape anisotropy or any combination thereof All the ferromagnetic flux guides are each an array of rectangular strips, and are all made of a soft ferromagnetic alloy, wherein the alloy may include, but not limited to, one or more elements including Ni, Fe, Co, Si, B, Ni, Zr and Al. The bonding pads 2 include input/output connection bonding pads in the X-axis sensor, the Y-axis sensor and the Z-axis sensor. The substrate 1 may include an ASIC, or may be electrically connected to an additional ASIC chip, and the ASIC is not shown in the drawing. The monolithic three-axis linear magnetic sensor may be packaged by using wire bonding of bonding pads, flip-chip, ball grid array (BGA), wafer level package (WLP) or chip on board (COB).

The X axis, the Y axis and the Z axis are pairwise orthogonal to each other. The X-axis sensor 3, the Y-axis sensor 4 and the Z-axis sensor 5 have the same sensitivity.

Figure 2:
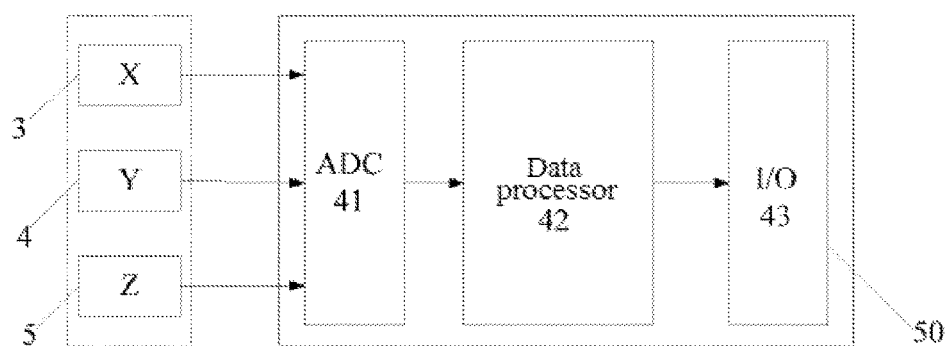
FIG. 2 is a schematic diagram of a digital signal processing circuit of the monolithic three-axis linear magnetic sensor in the present invention.

FIG. 2 is a schematic diagram of a digital signal processing circuit of the monolithic three-axis linear magnetic sensor. Magnetic signals sensed by the X-axis sensor 3, the Y-axis sensor 4 and the Z-axis sensor 5 are analog-to-digital converted by using an ADC 41 in a digital signal processing circuit 50, converted digital signals are transmitted to a data processor 42, and processed signals are output by an I/O 43, thereby implementing measurement on an external magnetic field. The digital signal processing circuit 50 may be placed on the substrate 1, or placed on another ASIC chip, the ASIC chip being electrically connected to the substrate 1.

Figure 3:
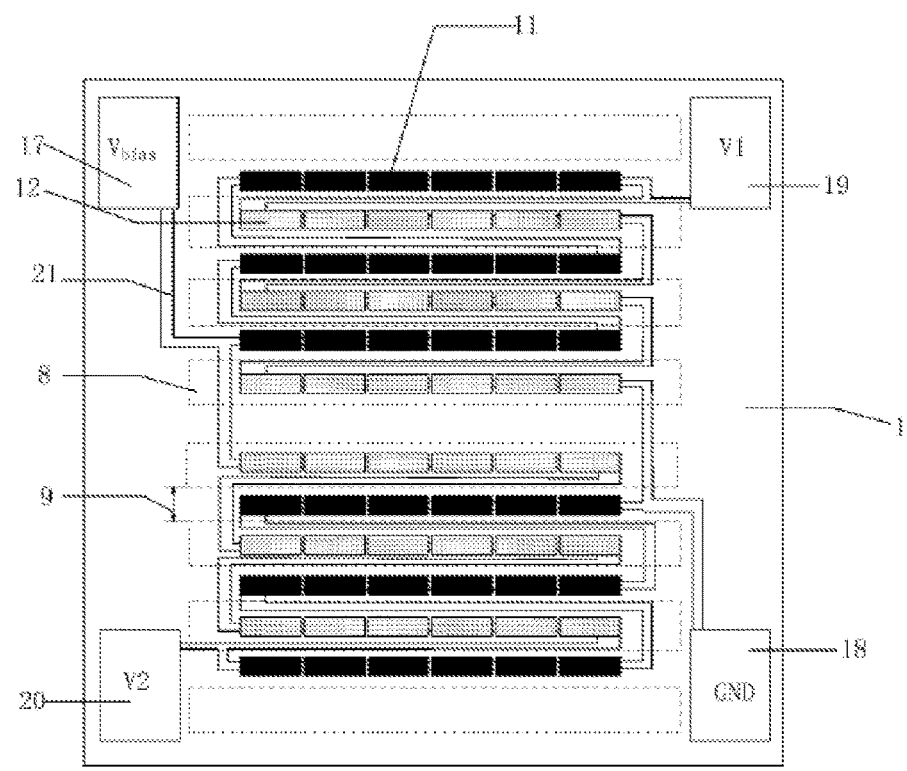
FIG. 3 is a schematic structural diagram of an X-axis sensor.

FIG. 3 is a schematic structural diagram of the X-axis sensor in FIG. 1. The X-axis sensor is of a reference full-bridge structure, and includes a reference arm and a sensing arm, wherein the reference arm includes a plurality of reference element series 12 placed beneath the X ferromagnetic flux guides, and the sensing arm includes a plurality of sensing element series 11 placed at gaps 9 of the X ferromagnetic flux guides. The sensing element series 11 and the reference element series are mutually staggered, and arranged along the length directions of the X ferromagnetic flux guides, wherein each one of the sensing element series 11 is spaced from the adjacent one of the reference element series 12 by an interval L. However, for an even number (eight) X ferromagnetic flux guides shown in FIG. 2, two reference element series 12 in the middle are adjacent to each other, and the interval therebetween is 2L. If there are an odd number of X ferromagnetic flux guides, there will be two sensing element series 11 adjacent to each other in the middle, and the adjacent interval is also 2L, but this situation is not shown in FIG. 2. The interval L is very small, preferably 20-100 microns. The sensing arm, the reference arm and the bonding pads 17-20 may be connected by an electrical connection conductor 21. The bonding pads 17-20 are each used as an input end Vbias, a ground end GND, and output ends V1, V2, corresponding to the leftmost four bonding pads in FIG. 1.

Figure 4:
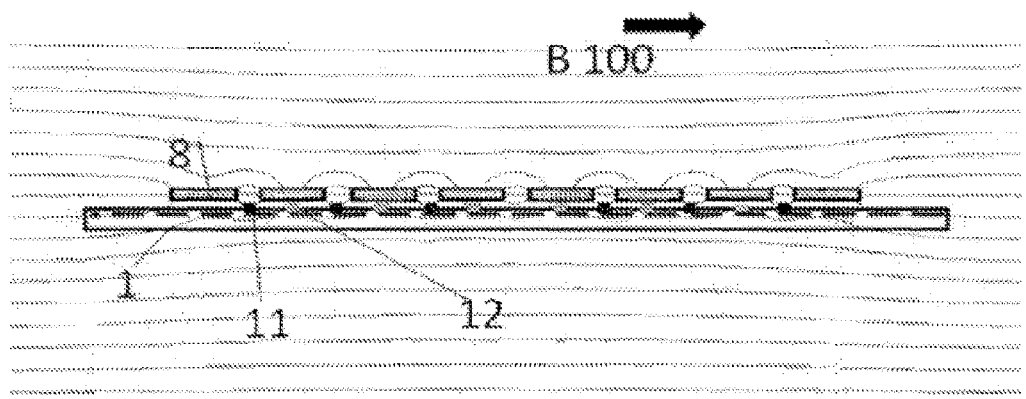
FIG. 4 is a distribution diagram of magnetic fields around magnetoresistive elements in the X-axis sensor.

FIG. 4 shows distribution of magnetic fields around the sensing element series 11 and the reference element series 12 in FIG. 3. It can be seen from the drawing that the magnitude of the magnetic field sensed by the sensing element series 11 at the gap of the X ferromagnetic flux guides 8 is increased, and the magnitude of the magnetic field sensed by the reference element series 12 placed beneath the X ferromagnetic flux guides 8 is reduced, and it is thus clear that the X-ferromagnetic flux guides 8 can play a role of attenuating magnetic fields.

Figure 5:
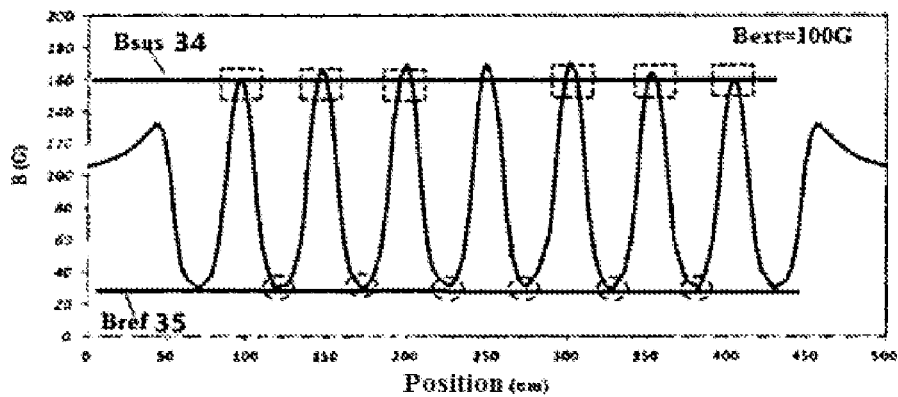
FIG. 5 is a relation curve of the position of an MTJ element in the X-axis sensor vs. the intensity of a magnetic field sensed.

FIG. 5 is a relation curve of positions of the sensing element series 11 and the reference element series 12 in FIG. 3 vs. intensities of magnetic fields sensed, wherein, $B_{sns}$ 34 is the intensity of a magnetic field sensed by the sensing element series 11, $B_{ref}$ 35 is the intensity of a magnetic field sensed by the reference element series 12, and the intensity of an external magnetic field is $B_{ext}=100$ G. It can be obtained from the drawing that: $B_{sns}=160$ G, $B_{ref}=25$ G. Magnitudes of a corresponding gain coefficient $A_{sns}$ and a corresponding attenuation coefficient $A_{ref}$ may be obtained according to the following formulas (1) and (2).

$$B_{sns}=A_{sns}*B_{ext} \qquad (1)$$

$$B_{ref}=A_{ref}*B_{ext} \qquad (2)$$

$B_{ext}$=100 G, $B_{sns}$=160 G, and $B_{ref}$=25 G are substituted into the above formulas to obtain:

1<Asns=1.6<100, 0<Aref=0.25<1. A greater ratio of $A_{sns}/A_{ref}$ indicates a higher sensitivity of the sensor. Generally, it is ideal that $A_{sns}/A_{ref}$>5, and at this point, the sensor has a high sensitivity. In this design, $A_{sns}/A_{ref}$=1.6/0.25=6.4>5, and it is thus clear that the X-axis sensor of this application has a high sensitivity.

Figure 6:
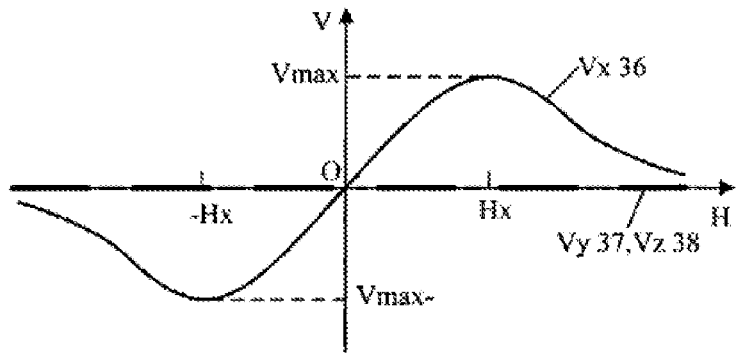
FIG. 6 is a response curve of the X-axis sensor.

FIG. 6 is a relation curve of an output voltage of the X-axis sensor in FIG. 3 vs. the external magnetic field. It can be seen from the drawing that the X-axis sensor can only sense a magnetic field component in an X-axis direction, the output voltage Vx36 does not respond to magnetic field components in a Y-axis direction and a Z-axis direction; voltages Vy37 and Vz38 are both zero, and Vx36 is symmetric about the origin 0.

Figure 7:
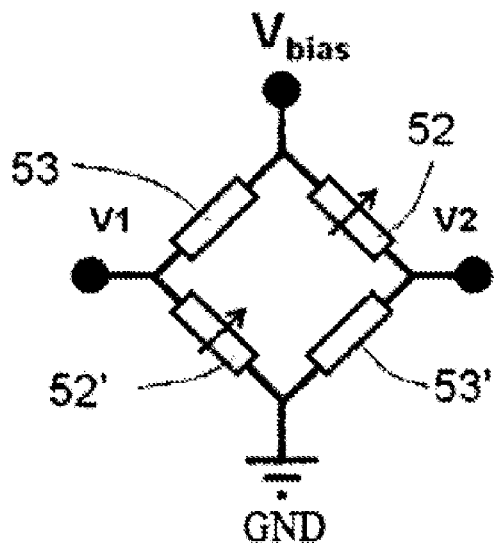
FIG. 7 is a schematic circuit diagram of the X-axis sensor.

FIG. 7 is a schematic circuit diagram of the X-axis sensor in FIG. 3.

In the drawing, two sensing arms 52, 52' and two reference arms 53, 53' are connected at an interval to construct a full bridge, and an output voltage of the full bridge is $$V = V1 - V2 = \frac{R_{sns}}{R_{sns}+R_{ref}}V_{bias} - \frac{R_{ref}}{R_{sns}+R_{ref}}V_{bias} = \frac{(A_{sns}-A_{ref})\left(\frac{\Delta R}{\Delta B}\right)B}{2R_L+(A_{sns}+A_{ref})\left(\frac{\Delta R}{\Delta B}\right)B}V_{bias} \quad (3)$$

Then, the sensitivity of the X-axis sensor may be expressed as:

$$\frac{V}{V_{bias}} = \frac{(A_{sns}-A_{ref})\left(\frac{\Delta R}{\Delta B}\right)B}{2R_L+(A_{sns}+A_{ref})\left(\frac{\Delta R}{\Delta B}\right)B} \quad (4)$$

For a very small external magnetic field, that is, the magnetic field intensity B is very small, the above formula (4) may be approximated to:

$$\frac{V}{V_{bias}} \approx \frac{(A_{sns}-A_{ref})}{2R_L}\left(\frac{\Delta R}{\Delta B}\right)B \quad (5)$$

Figure 8:
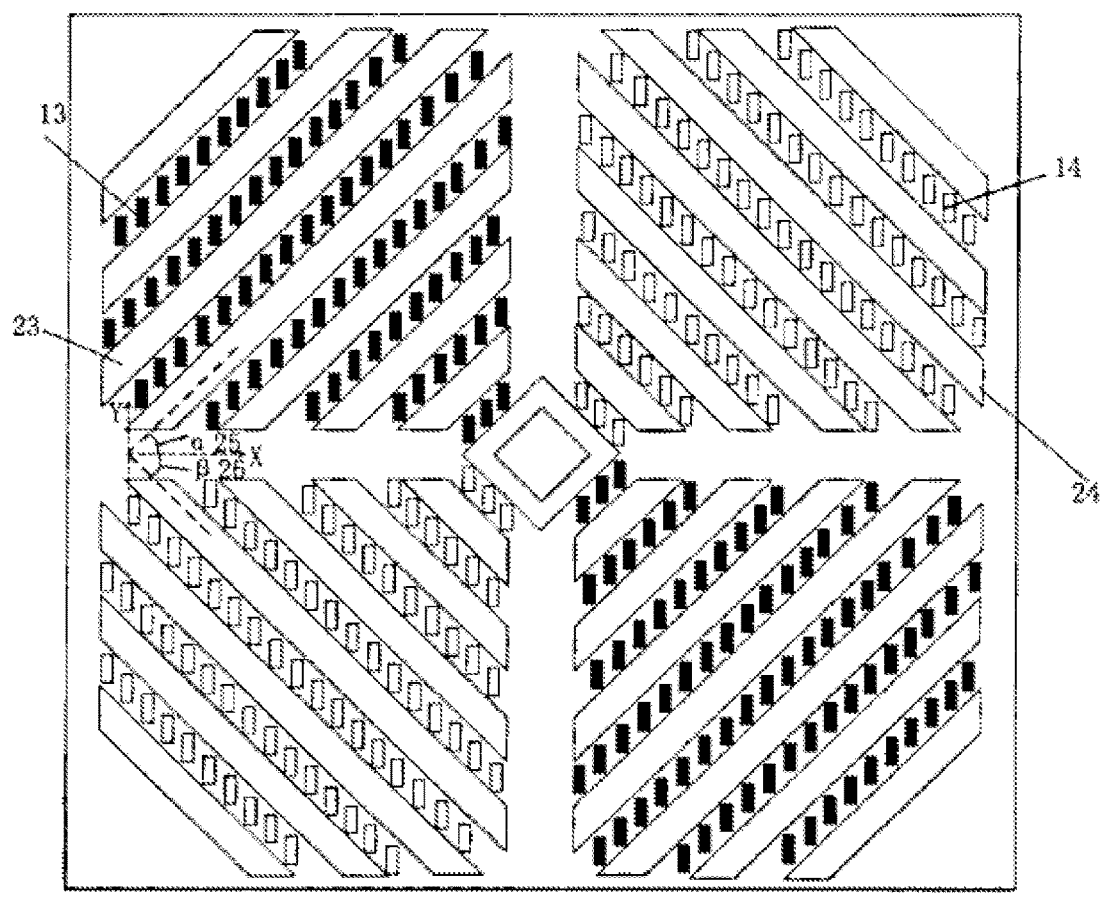
FIG. 8 is a schematic structural diagram of a Y-axis sensor.

FIG. 8 is a schematic structural diagram of the Y-axis sensor in FIG. 1. The sensor is of a push-pull full-bridge structure, including a plurality of Y ferromagnetic flux guides 23, 24 disposed obliquely and magnetoresistive sensing elements 13, 14 electrically connected to form a push arm and a pull arm. Wherein the magnetoresistive sensing elements 13 are placed at gaps between the adjacent two of the Y ferromagnetic flux guides 23, the magnetoresistive sensing elements 14 are placed at gaps between the adjacent two of the Y ferromagnetic flux guides 24, angles between the Y ferromagnetic flux guides 23, 24 and the X axis are α 25 and β 26, respectively. Preferably, |α|=|β|, and α and β range from 0° to 90° and −90° to −0°, respectively. In this embodiment, α=45°, and β=−45°. The numbers of the magnetoresistive sensing elements 13, 14 are the same and the magnetoresistive sensing elements 13, 14 in opposite positions are parallel to each other, they can also rotate, and their rotation angles are at the same amplitude but in different directions. The input and output bonding pads of the Y-axis sensor are not shown in the drawing, corresponding to the middlemost four bonding pads in the bonding pads 2 in FIG. 1.

Figure 9:
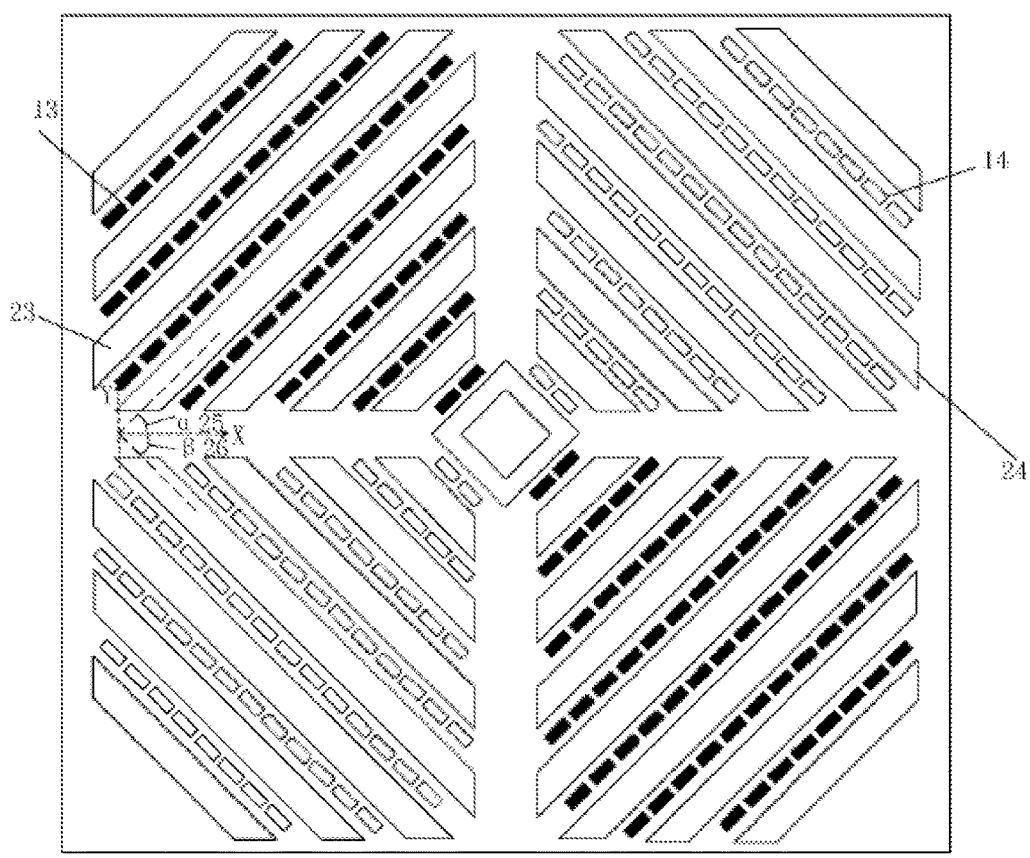
FIG. 9 is another schematic structural diagram of the Y-axis sensor.

FIG. 9 is another schematic structural diagram of the Y-axis sensor. The magnetoresistive elements 13, 14 in FIG. 8 rotate by ±45° respectively to obtain the structure shown in this drawing, and FIG. 9 is different from FIG. 8 in that the magnetoresistive elements 13, 14 are parallel to the Y ferromagnetic flux guides 23, 24, respectively.

Figure 10:
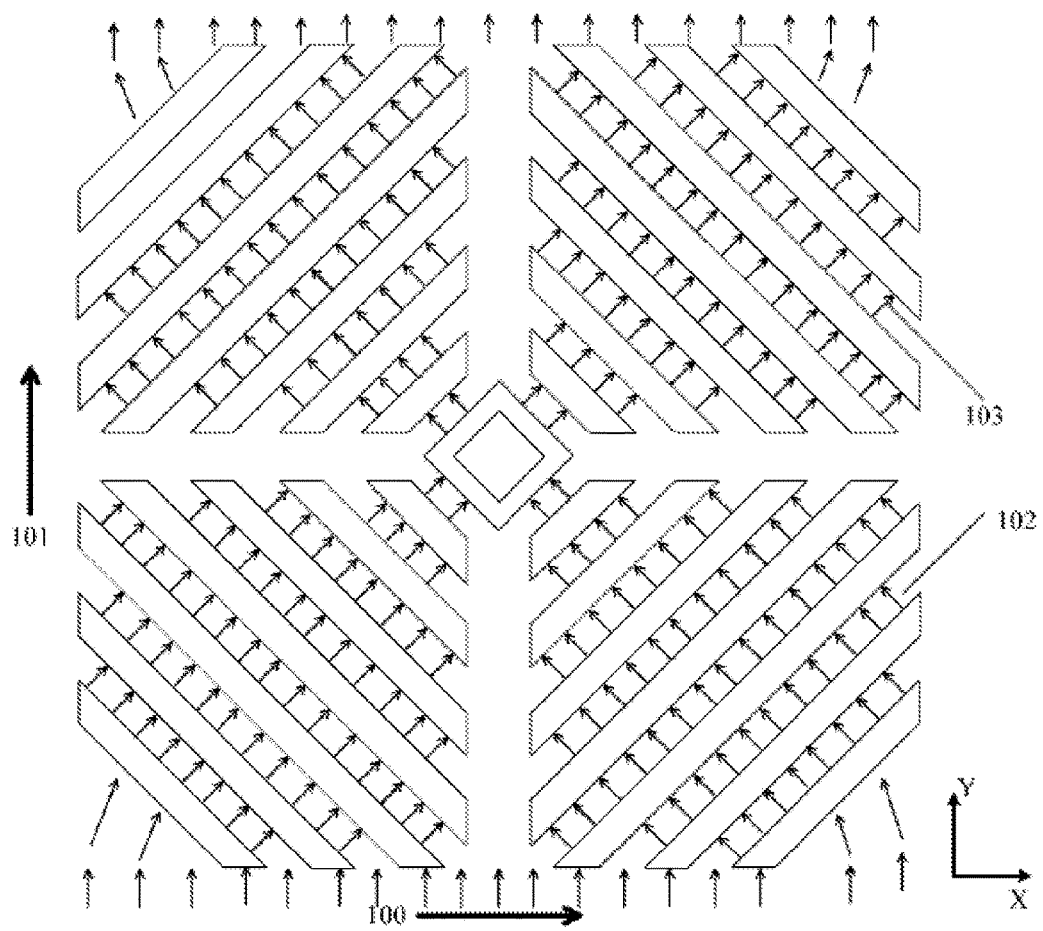
FIG. 10 is a distribution diagram of magnetic fields of the Y-axis sensor in a Y-direction magnetic field.

FIG. 10 is a distribution diagram of magnetic fields of the Y-axis sensor in a Y-direction magnetic field. In the drawing, the direction 101 of the external magnetic field is parallel to the Y axis, and the measurement direction 100 is parallel to the X axis. It can be seen from the drawing that the external magnetic field entering into the sensor is biased by the Y ferromagnetic flux guides 23, 24, wherein the magnetic field direction at the gap of the Y ferromagnetic flux guides 23 is 102, and the magnetic field direction at the gap of the Y ferromagnetic flux guides 24 is 103. The magnetic field directions 102 and 103 are symmetric about the Y axis. In this embodiment, the external magnetic field By=100 G, the size of the X-axis magnetic field measured $B_{X+}$=90 G, $B_{X-}$=−90 G, and then the gain coefficient Axy=Bx/By=$(B_{X-}-B_{X-})$/By=180/100=1.8.

Figure 11:
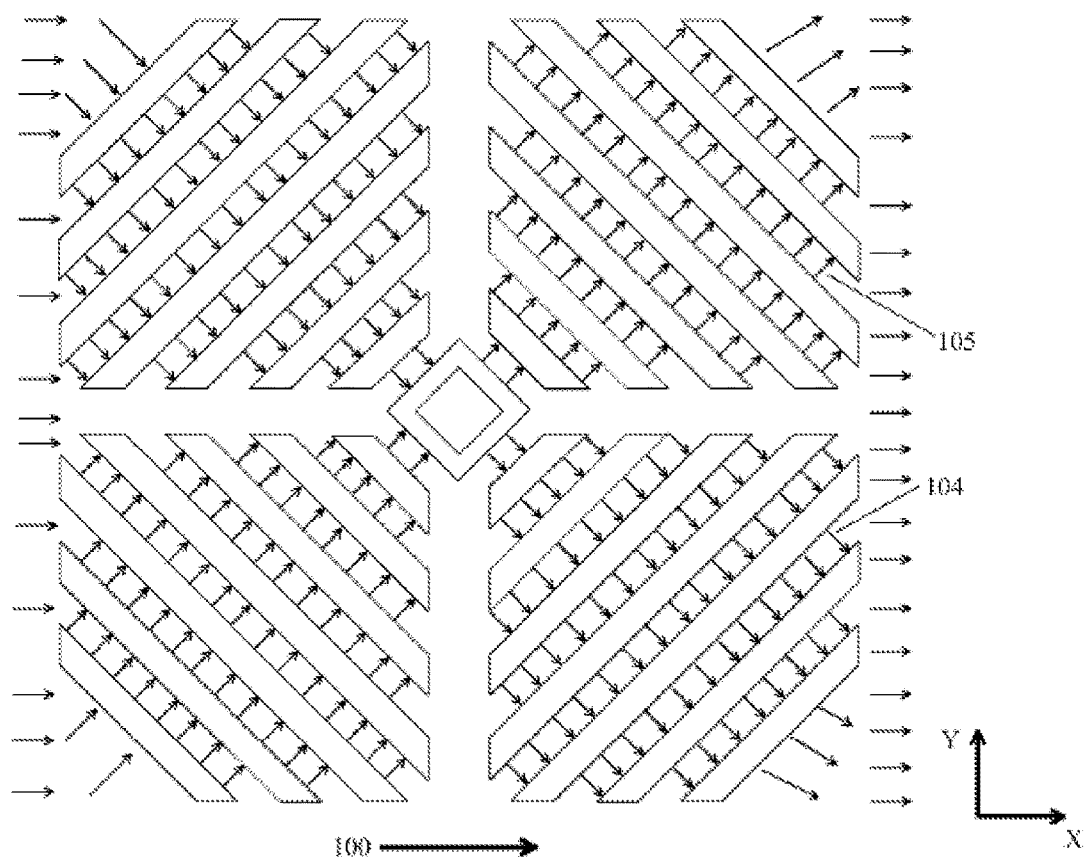
FIG. 11 is a distribution diagram of magnetic fields of the Y-axis sensor in an X-direction magnetic field.

FIG. 11 is a distribution diagram of magnetic fields of the Y-axis sensor in an X-direction magnetic field. In the drawing, the direction of the external magnetic field and the measurement direction are both the direction 100 parallel to the X axis. The magnetic field direction at the gap of the Y ferromagnetic flux guides 23 is 104, and the magnetic field direction at the gap of the Y ferromagnetic flux guides 24 is 105. The magnetic field directions 104 and 105 are symmetric about the X axis. In this embodiment, the external magnetic field Bx=100 G, the size of the X-axis magnetic field measured $B_{X+}$=101 G, $Bx_{X-}$=−101 G, and then the gain coefficient Axx=$(B_{X+}-B_{X-})$/Bx=(101−101)/100=0. It is thus clear that the components of the magnetic fields on the two bridge arms on the X axis offset each other and X-axis magnetic field signals cannot be detected.

Figure 12:
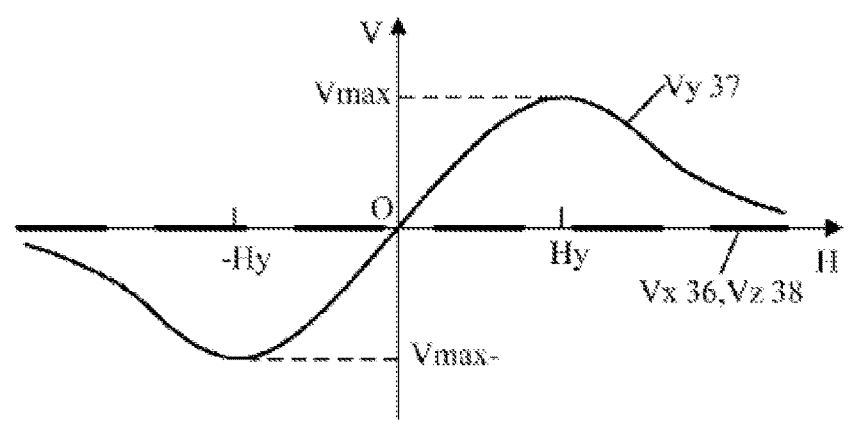
FIG. 12 is a response curve of the Y-axis sensor.

FIG. 12 is a relation curve of an output voltage of the Y-axis sensor vs. an external magnetic field. It can be seen from the drawing that the Y-axis sensor can only sense the magnetic component in the Y-axis direction, the output voltage Vy 37 does not respond to magnetic field components in the X-axis and Z-axis directions, voltages Vx36 and Vz38 are both 0, and Vy37 is symmetric about the origin 0.

Figure 13:
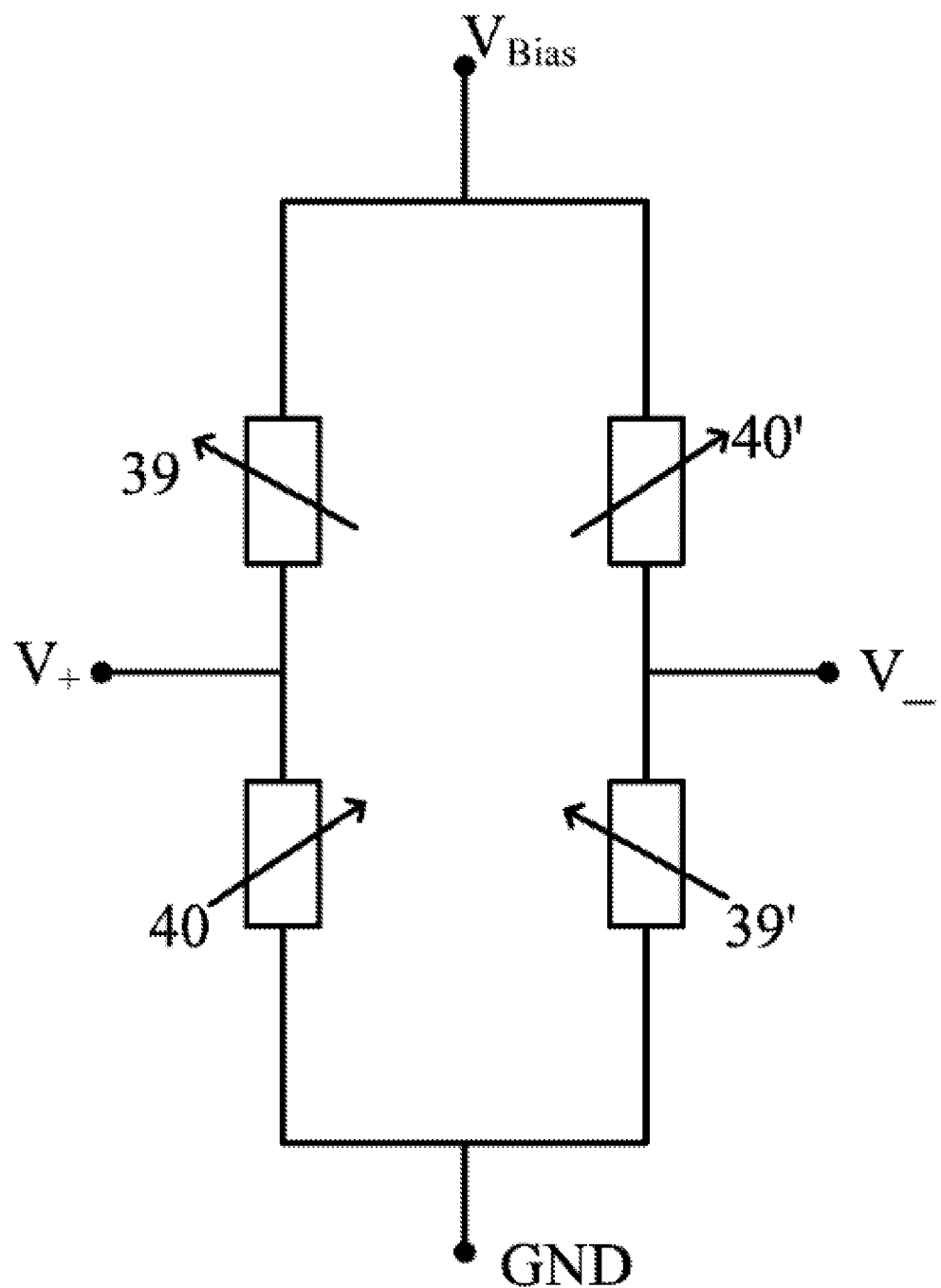
FIG. 13 is a schematic circuit diagram of the Y-axis sensor.

FIG. 13 is a schematic circuit diagram of the Y-axis sensor. Several magnetoresistive sensing elements 13 are electrically connected to form equivalent magnetoresistors R39 and R39', several magnetoresistive sensing elements 14 are electrically connected to form equivalent magnetoresistors R40 and R40', and the four magnetoresistors are connected to construct a full bridge. Magnetization directions of their magnetic pinned layers are the same, magnetization directions of magnetic free layers of the magnetoresistors in opposite positions (R39 and R39', R40 and R40') are the same, and magnetization directions of magnetic free layers of the magnetoresistors in adjacent positions (R39 and R40, R39 and R40', R39' and R40, R39' and R40') are different. When an external magnetic field is applied along the sensing directions of the magnetoresistive sensing elements 13 and 14, changing situations of resistances of the magnetoresistors R39, R39' may be opposite to changing situations of resistances of the magnetoresistors R40, R40', thereby constructing a push-pull output. An output voltage of the full bridge is:

$$V = V_+ - V_- = \frac{R40}{R39 + R40}V_{bias} - \frac{R39'}{R39' + R40'}V_{bias} \quad (6)$$

Generally, R39=R39', R40=R40', and the above formula may be simplified as:

$$V = V_+ - V_- = \frac{R40 - R39}{R39 + R40}V_{bias} \quad (7)$$

Then the sensitivity of the Y-axis sensor may be expressed as:

$$\frac{V}{V_{bias}} = \frac{R40 - R39}{R39 + R40} \quad (8)$$

Figure 14:
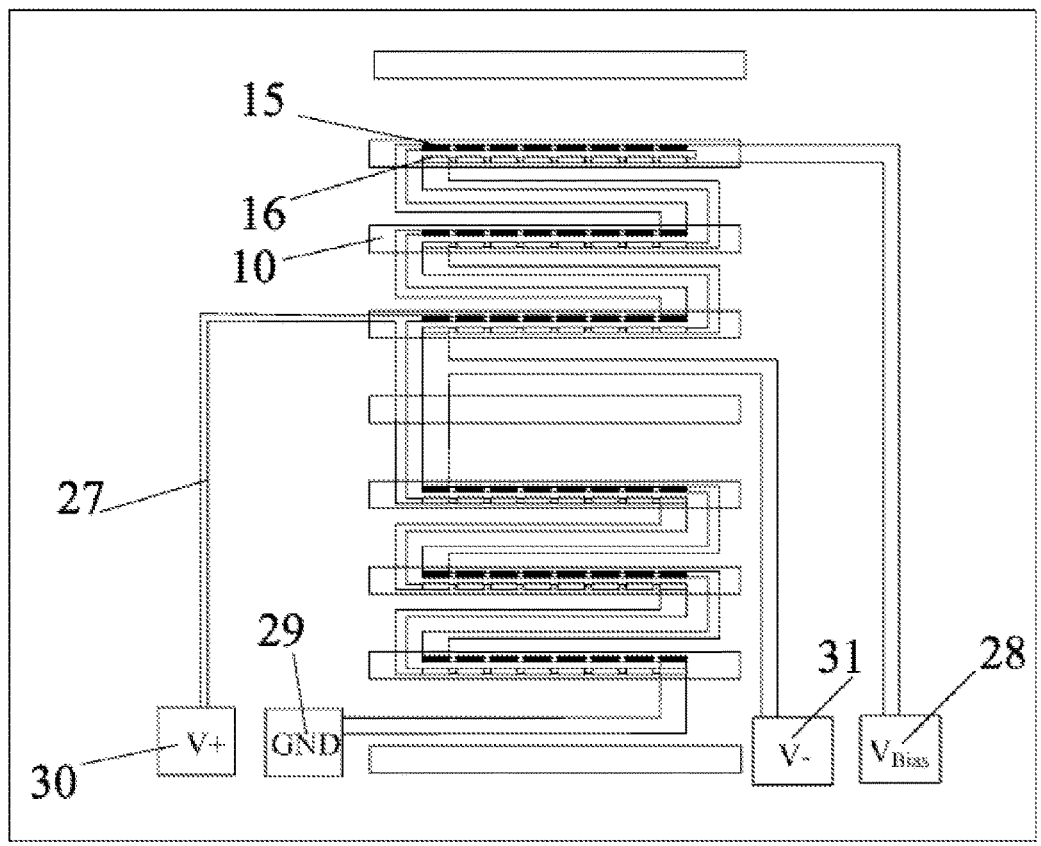
FIG. 14 is a schematic circuit diagram of a Z-axis sensor.
Figure 15:
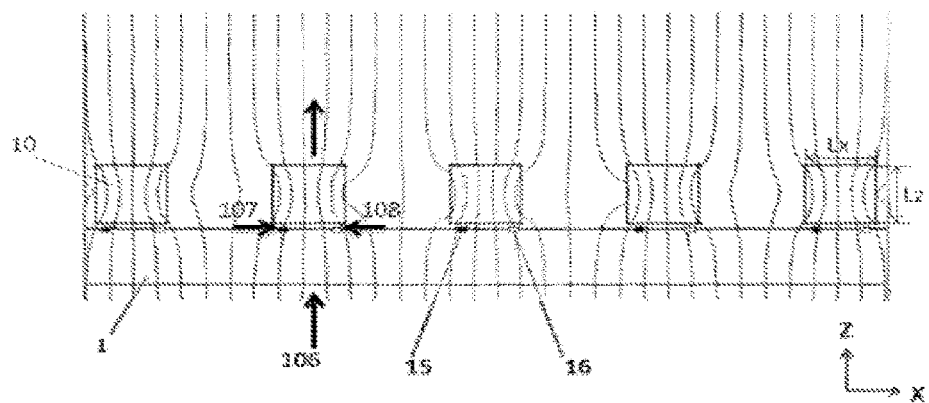
FIG. 15 is a distribution diagram of magnetic fields around ferromagnetic flux guides of the Z-axis sensor in a Z-direction magnetic field.

FIG. 14 is a schematic structural diagram of a Z-axis sensor. The Z-axis sensor is of a push-pull full-bridge structure. The Z-axis sensor includes a plurality of magnetoresistive sensing elements 15 and 16, a plurality of Z ferromagnetic flux guides 10, an electrical connection conductor 27, and bonding pads 28-30, wherein the bonding pads 28-31 are each used as a power supply end $V_{Bias}$, a ground end GND, and voltage output ends V+, V−, corresponding to the rightmost four bonding pads in the bonding pads 2 in FIG. 1. All the magnetoresistive sensing elements 15 are electrically interconnected to form a push arm of the full bridge, and all the magnetoresistive sensing elements 16 are electrically interconnected to form a pull arm of the full bridge. The push arm is arranged to be spaced from the pull arm, and the push arm, the pull arm and the bonding pads 28-30 are connected by the electrical connection conductor 27 to form the push-pull full bridge. The magnetoresistive sensing elements 15, 16 are arranged along the length directions of the Z ferromagnetic flux guides 10. In FIG. 14, the magnetoresistive sensing elements 15, 16 are arranged at two sides at the bottom of the Z ferromagnetic flux guide 10 in rows, and are covered by the Z ferromagnetic flux guides 10. Except for the three Z ferromagnetic flux guides 10 at the upper and lower ends and in the middle, a row of push arm magnetoresistive sensing elements 15 and a row of pull arm magnetoresistive sensing elements 16 are arranged at two sides at the bottom of each Z ferromagnetic flux guide 10, and if necessary, the magnetoresistive sensing elements 15, 16 may also be arranged beneath the three Z ferromagnetic flux guides 10. FIG. 15 is a diagram of distribution of magnetic fields of the Z-axis sensor in an external magnetic field 106 in the Z-axis direction. It can be seen from the distribution of magnetic force lines in the drawing that the external magnetic field is distorted near the Z ferromagnetic flux guides 10, thereby generating the magnetic field component in the X-axis direction, and the magnetoresistive sensing elements 15 and 16 beneath the Z ferromagnetic flux guides 10 can just detect this component; however, directions of the magnetic field components detected by them are opposite to each other, and are 107 and 108 respectively. The magnitude of the applied external magnetic field can be known according to the detected X-axis magnetic field component.

Figure 16:
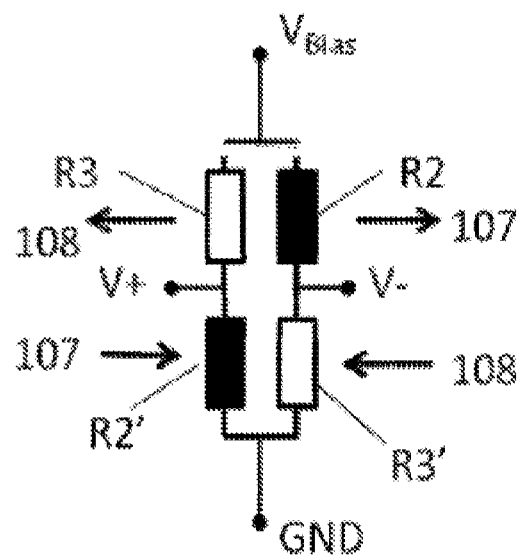
FIG. 16 is a schematic circuit diagram of the Z-axis sensor.

FIG. 16 is a schematic circuit diagram of the Z-axis sensor. Several magnetoresistive sensing elements 15 are electrically connected to form equivalent magnetoresistors R2 and R2', several magnetoresistive sensing elements 16 are electrically connected to form two equivalent magnetoresistors R3 and R3', and the four magnetoresistors are connected to construct a full bridge. When an external magnetic field in the Z-axis direction is applied, changing situations of resistances of the magnetoresistors R2, R2' and R3, R3' may be opposite to each other, thereby constructing a push-pull output. Generally, R2'=R2, and R3'=R3. It can be obtained from FIG. 15 that an output voltage of the circuit is:

$$V_{out} = V_+ - V_- = \frac{R2 - R3}{R2 + R3}V_{bias} \quad (9)$$

The sensitivity thereof is:

$$\frac{V_{out}}{V_{bias}} = \frac{R2 - R3}{R2 + R3} \quad (10)$$

Figure 17:
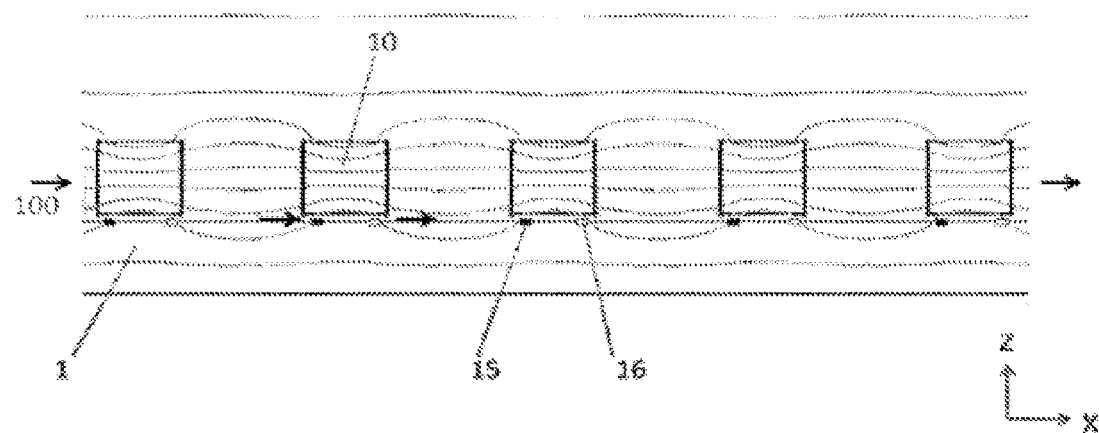
FIG. 17 is a distribution diagram of magnetic fields around ferromagnetic flux guides of the Z-axis sensor in an X-direction magnetic field.

FIG. 17 is a diagram of magnetic field distribution of the Z-axis sensor in an external magnetic field 100 in the X-axis direction. It can be seen from the drawing that magnetic fields detected by the magnetoresistive sensing elements 15 and 16 are the same, this may result in that changing situations of resistances of the magnetoresistors R2, R2' and R3, R3' are the same, such that no push-pull output is formed, and therefore, the sensor will not respond.

Figure 18:
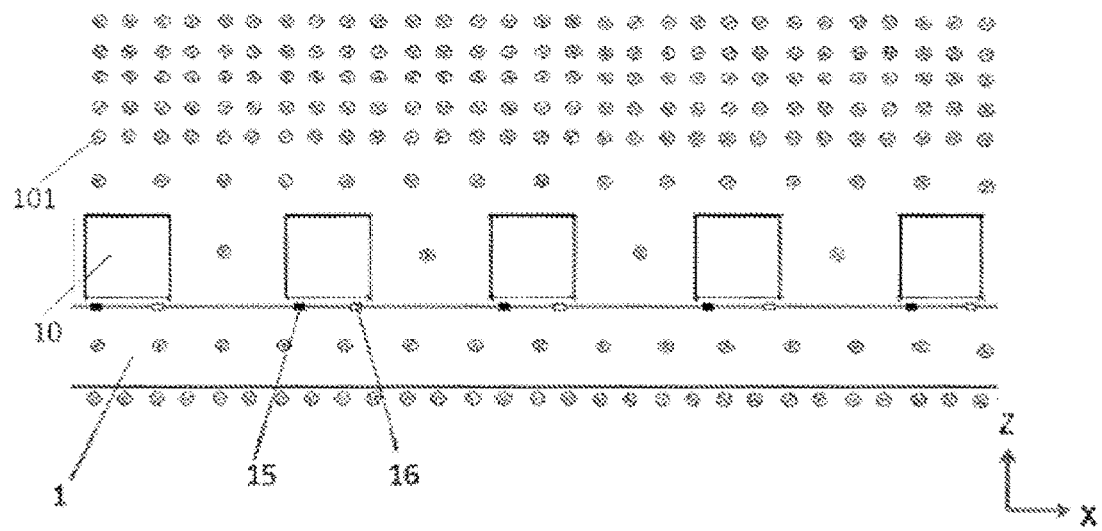
FIG. 18 is a distribution diagram of magnetic fields around ferromagnetic flux guides of the Z-axis sensor in a Y-direction magnetic field.

FIG. 18 is a diagram of magnetic field distribution of the Z-axis sensor in an external magnetic field 101 in the Y-axis direction. It can be seen from the drawing that the Z ferromagnetic flux guide 10 completely shields the external magnetic field in the Y-axis direction, and the magnetoresistive sensing elements 15, 16 are insensitive to the magnetic field in the Y-axis direction; therefore, the magnetoresistive sensing elements 15, 16 do not detect any magnetic field component, and the Z-axis sensor does not respond either.

Figure 19:
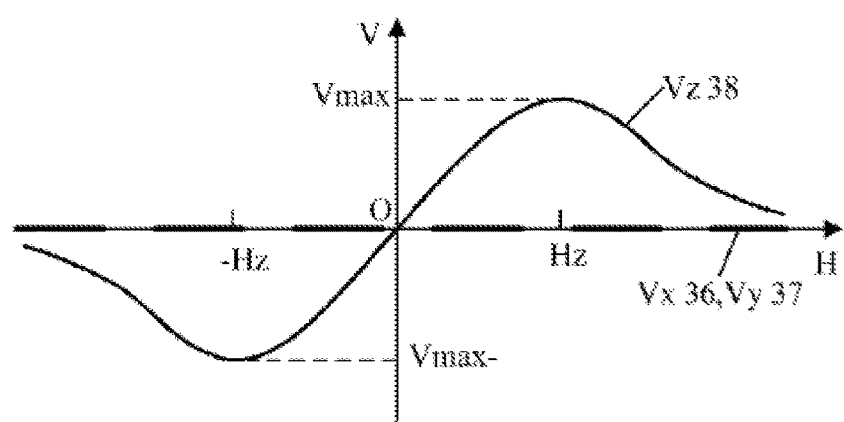
FIG. 19 is a response curve of the Z-axis sensor.

FIG. 19 is a relation curve of an output voltage of the Z-axis sensor vs. an external magnetic field. It can be seen from the drawing that the Z-axis sensor can only sense the magnetic component in the Z-axis direction, the output voltage Vz38 does not respond to magnetic field components in the X-axis and Y-axis directions, voltages Vx36 and Vy37 are both 0, and Vz38 is symmetric about the origin 0.

The above discusses the situations when the bridges in the X-axis sensor, the Y-axis sensor and the Z-axis sensor are full bridges, and since working principles of a half bridge and a quasi bridge are the same as the full bridge, they are not repeated herein. The conclusions obtained above are also applicable to monolithic three-axis linear magnetic sensors in a half-bridge structure and a quasi-bridge structure.

Embodiment 2

Figure 20:
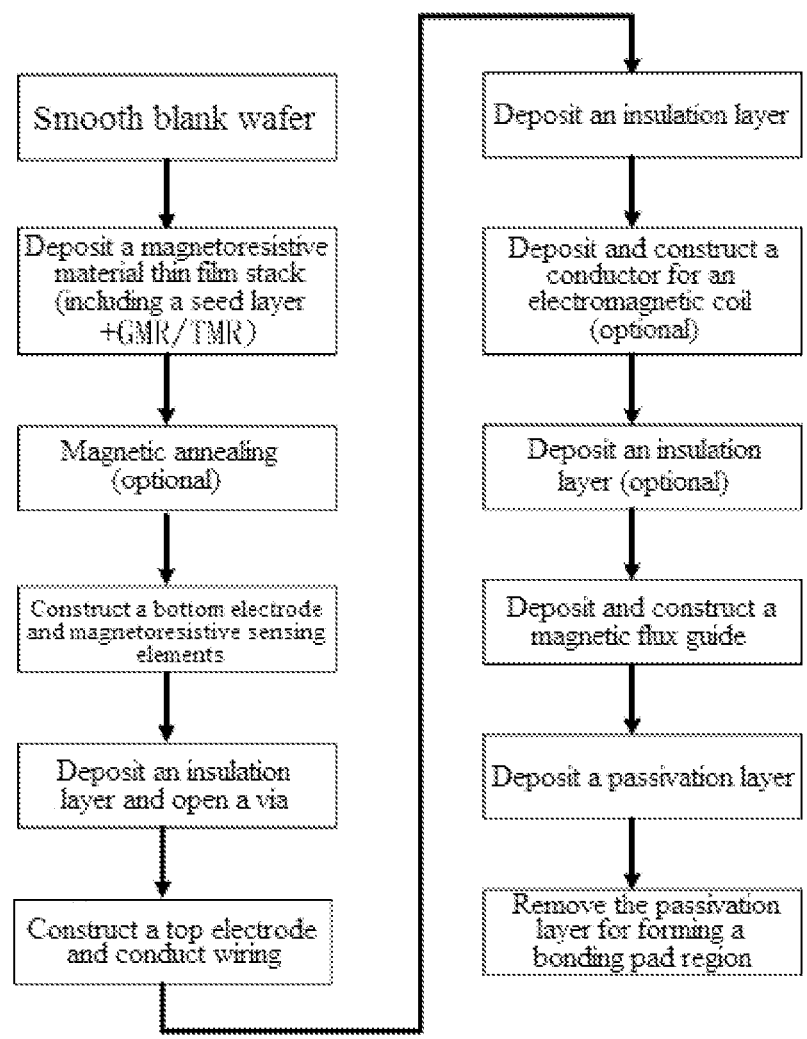
FIG. 20 is a schematic flow chart of a method for manufacturing a monolithic three-axis linear magnetic sensor in the present invention.

FIG. 20 is a method for manufacturing a monolithic three-axis linear magnetic sensor in the present invention, and the method includes the following steps:

(1) depositing a magnetoresistive material thin film stack on a wafer, and setting a magnetization direction of a pinned layer on the magnetoresistive material thin film stack by using a related process, preferably setting the magnetization direction of the pinned layer to be along the same direction by thermal annealing in a magnetic field, and setting electrical properties and magnetic properties thereof, including impedance, threshold voltage, hysteresis, anisotropy, saturated magnetic field and so on, wherein the magnetic properties are specific to the pinned layer and a free layer, while the electrical properties are specific to a tunnel junction. In the magnetoresistive material thin film stack, the pinned layer is pinned by using an antiferromagnetic material having a blocking temperature of TB1, and the free layer is biased by using a second antiferromagnetic material having a blocking temperature of TB2, wherein TB1>TB2. The thermal annealing conducted in the magnetic field may also be two-step thermomagnetic annealing, including the following steps: first annealing the wafer in a magnetic field having a temperature of T1, wherein T1>TB1; next cooling in a magnetic field having a temperature of T2, wherein TB1>T2>TB2; after the temperature of the wafer is cooled down to T2, rotating the direction of the wafer or an external magnetic field by 90 degrees; then cooling the wafer to a temperature T3, and removing the external magnetic field, wherein TB2>T3; and finally cooling the wafer to the normal temperature.

The magnetoresistive material thin film includes a seed layer, and GMR or TMR elements may be generated on the seed layer.

(2) constructing a bottom electrode on the wafer deposited with the magnetoresistive material thin film stack, and constructing magnetoresistive sensing elements in an X-axis sensor, a Y-axis sensor and a Z-axis sensor on the same magnetoresistive material thin film in the same technical process at the same time by a technology such as lithography, ion etching, reaction ion etching, wet etching, lift off or hard masking;

(3) depositing an insulation layer I above the magnetoresistive sensing elements, and forming a via that provides an electrical connection for the magnetoresistive sensing elements by a technology such as lithography, ion etching, reaction ion etching or wet etching. The via may be a self-aligned contact hole which is formed by a lift off process or a hard masking process.

(4) depositing a top metal layer above the via, constructing the top metal layer into a top electrode, and conducting wiring between the elements;

(5) depositing an insulation layer II above the top metal layer, and then depositing a soft ferromagnetic alloy material layer (e.g., NiFe) above the insulation layer II. If necessary, it is also possible to first deposit a conductor for constructing an electromagnetic coil on the insulation layer II, then deposit an insulation layer III on the electromagnetic coil, next deposit a soft ferromagnetic alloy material layer on the insulation layer III, and construct an X ferromagnetic flux guide, a Y ferromagnetic flux guide and a Z ferromagnetic flux guide on the soft ferromagnetic alloy material layer at the same time; and (6) depositing a passivation layer above all the X ferromagnetic flux guide, the Y ferromagnetic flux guide and the Z ferromagnetic flux guide at the same time, etching the passivation layer and opening vias at positions corresponding to the bottom electrode and the top electrode, and forming a bonding pad connected externally.

Figure 21:
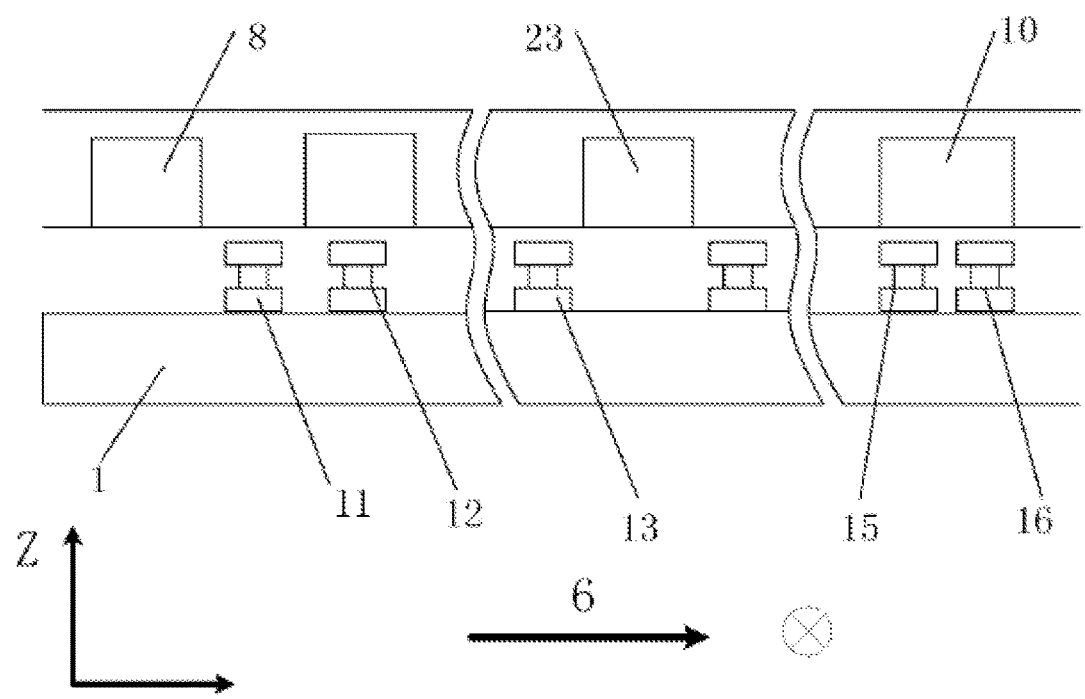
FIG. 21 is a schematic sectional diagram of a manufactured monolithic three-axis linear magnetic sensor.

A schematic sectional diagram of a monolithic three-axis linear magnetic sensor after the above steps are implemented is shown in FIG. 21. In FIG. 21, the X-axis sensor, the Y-axis sensor and the Z-axis sensor are correspondingly placed in sequence from left to right. Since left and right bridge arms in the Y-axis sensor are symmetric, merely the Y ferromagnetic flux guides 23 on one bridge arm and the magnetoresistive sensing elements 13 at gaps thereof are shown. In this embodiment, the magnetoresistive elements in the above steps are MTJ elements.

The above descriptions are merely preferred embodiments of the present invention, and are not intended to limit the present invention. For those skilled in the art, the present invention may have various modifications and changes. Any modification, equivalent replacement, improvement and the like without departing from the spirit and principle of the present invention should all fall within the protection scope of the present invention.

The invention claimed is:

1. A monolithic three-axis linear magnetic sensor, the sensor comprising:
   a substrate in an XY plane, the substrate having an X-axis sensor, a Y-axis sensor and a Z-axis sensor integrated thereon, each of which comprises one or more identical magnetoresistive sensing elements that are electrically interconnected, for detecting components of a magnetic field in an X-axis direction, a Y-axis direction and a Z-axis direction, respectively;
   the X-axis sensor comprising a referenced bridge and at least two X ferromagnetic flux guides, a reference arm and a sensing arm of the referenced bridge being arranged alternately and each comprising the one or more identical magnetoresistive sensing elements that are electrically interconnected; the magnetoresistive sensing elements on the reference arm being placed above or beneath the X ferromagnetic flux guides, and being arranged along length directions of the X ferromagnetic flux guides to form reference element series; the magnetoresistive sensing elements on the sensing arm being placed at gaps between the adjacent two of the X ferromagnetic flux guides, and being arranged along the length directions of the X ferromagnetic flux guides to form sensing element series;
   the Y-axis sensor comprising a push-pull bridge, a push arm and a pull arm of the push-pull bridge each being correspondingly provided thereon with at least two Y ferromagnetic flux guides, the push arm and the pull arm being arranged alternately and each comprising the one or more identical magnetoresistive sensing elements that are electrically interconnected, and the magnetoresistive sensing elements being placed at gaps between the respective adjacent two of the Y ferromagnetic flux guides;
   the Z-axis sensor comprising a push-pull bridge and at least one Z ferromagnetic flux guide, a push arm and a pull arm of the push-pull bridge being arranged alternately and each comprising the one or more identical magnetoresistive sensing elements that are electrically interconnected; the magnetoresistive sensing elements on the push arm and the pull arm being placed at two sides of the bottom or the top of the Z ferromagnetic flux guide, respectively, and being arranged along the length direction of the Z ferromagnetic flux guide; and
   magnetization directions of pinned layers of all the magnetoresistive sensing elements in the X-axis sensor, the Y-axis sensor and the Z-axis sensor being all the same, and when there is no ferromagnetic flux guide, sensing directions of all the magnetoresistive sensing elements being the X-axis direction;
   wherein the X axis, the Y axis and the Z axis are pairwise orthogonal to each other.

2. The monolithic three-axis linear magnetic sensor according to claim 1, wherein the magnetoresistive sensing elements are GMR spin valve elements or TMR sensing elements.

3. The monolithic three-axis linear magnetic sensor according to claim 1, wherein the X ferromagnetic flux guides, the Y ferromagnetic flux guides and the Z ferromagnetic flux guide are all an array of rectangular strips, and are made of a soft ferromagnetic alloy.

4. The monolithic three-axis linear magnetic sensor according to claim 1, wherein each one of the reference element series is spaced from the adjacent one of the sensing element series by an interval L; when the number of the X ferromagnetic flux guides is an even number, two of the reference element series are adjacent to each other in the middle of the X-axis sensor, and the interval thereof is 2L; when the number of the X ferromagnetic flux guides is an odd number, two of the sensing element series are adjacent to each other in the middle of the X-axis sensor, and the interval thereof is 2L, wherein L is a natural number.

5. The monolithic three-axis linear magnetic sensor according to claim 1, wherein gain coefficients of magnetic fields at gaps between the X ferromagnetic flux guides are $1<A_{sns}<100$, and attenuation coefficients of magnetic fields above or beneath the X ferromagnetic flux guides are $0<A_{ref}<1$.

6. The monolithic three-axis linear magnetic sensor according to claim 1, wherein, for the Y-axis sensor, the numbers of the Y ferromagnetic flux guides on the push arm and the pull arm are the same; an angle $\alpha$ between the Y ferromagnetic flux guide on the push arm and the positive direction of the X axis is 0° to 90°, and an angle $\beta$ between the Y ferromagnetic flux guide on the pull arm and the positive direction of the X axis is −90° to 0°; or an angle $\alpha$ between the Y ferromagnetic flux guide on the push arm and the positive direction of the X axis is −90° to 0°, and an angle $\beta$ between the Y ferromagnetic flux guide on the pull arm and the positive direction of the X axis is 0° to 90°, wherein $|\alpha|=|\beta|$.

7. The monolithic three-axis linear magnetic sensor according to claim 6, wherein, for the Y-axis sensor, the numbers of the magnetoresistive sensing elements on the push arm and the pull arm are the same and the magnetoresistive sensing elements in opposite positions are parallel to each other; rotation angles of the magnetoresistive sensing elements on the push arm and the pull arm are at the same amplitude but in different directions.

8. The monolithic three-axis linear magnetic sensor according to claim 1, wherein, for the Z-axis sensor, the numbers of the magnetoresistive sensing elements on the push arm and the pull arm of the push-pull bridge are the same.

9. The monolithic three-axis linear magnetic sensor according to claim 1, wherein the ratio between the length and the width of the magnetoresistive sensing elements of the Z-axis sensor is greater than 1.

10. The monolithic three-axis linear magnetic sensor according to claim 1, wherein a gap S between the adjacent two of the Z ferromagnetic flux guides is not less than the width Lx of the Z ferromagnetic flux guide.

11. The monolithic three-axis linear magnetic sensor according to claim 10, wherein the gap S between the adjacent two of the Z ferromagnetic flux guides is greater than 2Lx.

12. The monolithic three-axis linear magnetic sensor according to claim 1, wherein the magnetoresistive sensing elements in the Z-axis sensor are located on outer sides of edges at two sides of the top or the bottom of the Z ferromagnetic flux guide.

13. The monolithic three-axis linear magnetic sensor according to claim 1, wherein the sensitivity of the Z-axis sensor can be increased by reducing the gap between the magnetoresistive sensing elements in the Z-axis sensor and the edge of the bottom of the Z ferromagnetic flux guide or increasing the thickness Lz of the Z ferromagnetic flux guide or reducing the width Lx of the Z ferromagnetic flux guide.

14. The monolithic three-axis linear magnetic sensor according to claim 1, wherein, when there is no external magnetic field, the magnetoresistive sensing elements achieve the magnetization direction of the magnetic free layer perpendicular to that of the pinned layer by permanent magnet bias, double-exchange interaction, shape anisotropy or any combination thereof.

15. The monolithic three-axis linear magnetic sensor according to claim 1, wherein the referenced bridge and the push-pull bridge are both of a half-bridge, full-bridge or quasi-bridge structure.

16. The monolithic three-axis linear magnetic sensor according to claim 1, wherein the substrate is integrated with an ASIC chip thereon, or the substrate is electrically connected to a separate ASIC chip.

17. The monolithic three-axis linear magnetic sensor according to claim 1, wherein semiconductor packaging methods of the monolithic three-axis linear magnetic sensor comprises wire bonding of bonding pads, flip-chip, ball grid array (BGA), wafer level package (WLP) or chip on board (COB).

18. The monolithic three-axis linear magnetic sensor according to claim 1, wherein the X-axis sensor, the Y-axis sensor and the Z-axis sensor have the same sensitivity.

19. A method for manufacturing a monolithic three-axis linear magnetic sensor, the method comprising:
(1) depositing a magnetoresistive material thin film stack on a wafer, and setting magnetization direction of a pinned layer, magnetic properties of the pinned layer, magnetic properties of a free layer and electrical properties of a tunnel junction in the magnetoresistive material thin film stack by thermal annealing in a magnetic field;
(2) constructing a bottom electrode, and constructing magnetoresistive sensing elements in an X-axis sensor, a Y-axis sensor and a Z-axis sensor on the magnetoresistive material thin film stack at the same time;
(3) depositing an insulation layer I above the magnetoresistive sensing elements, and forming, on the insulation layer I, a via that provides an electrical connection channel for the magnetoresistive sensing elements;
(4) depositing a top metal layer above the via, constructing the top metal layer into a top electrode, and conducting wiring between the elements;
(5) depositing an insulation layer II above the top metal layer, then depositing a soft ferromagnetic alloy material layer above the insulation layer II, and constructing an X ferromagnetic flux guide, a Y ferromagnetic flux guide and a Z ferromagnetic flux guide on the soft ferromagnetic alloy material layer at the same time; and
(6) depositing a passivation layer above all the X ferromagnetic flux guide, the Y ferromagnetic flux guide and the Z ferromagnetic flux guide at the same time, etching the passivation layer and opening vias at positions corresponding to the bottom electrode and the top electrode, and forming a bonding pad connected externally.

20. The manufacturing method according to claim 19, wherein, in the magnetoresistive material thin film stack, the pinned layer is pinned by using an antiferromagnetic material having a blocking temperature of TB1, and the free layer is biased by using a second antiferromagnetic material having a blocking temperature of TB2, wherein TB1>TB2; the thermal annealing conducted in the magnetic field is two-step thermomagnetic annealing, comprising the following steps: first annealing the wafer in a magnetic field having a temperature of T1, wherein T1>TB1; next cooling in a magnetic field having a temperature of T2, wherein TB1>T2>TB2; after the temperature of the wafer is cooled down to T2, rotating the direction of the wafer or an external magnetic field by 90 degrees; then cooling the wafer to a temperature T3, and removing the external magnetic field, wherein TB2>T3; and finally cooling the wafer to the normal temperature.

21. The manufacturing method according to claim 19, wherein, in step (2), the magnetoresistive sensing elements in the X-axis sensor, the Y-axis sensor and the Z-axis sensor are constructed on the magnetoresistive material thin film stack at the same time by lithography, ion etching, reaction ion etching, wet etching, lift off or hard masking.

22. The manufacturing method according to claim 19, wherein, in step (3), the via is formed by lithography, ion etching, reaction ion etching or wet etching.

23. The manufacturing method according to claim 19, wherein the via in step (3) is a self-aligned contact hole which is formed by a lift off process or a hard masking process.

24. The manufacturing method according to claim 19, wherein the depositing an insulation layer II above the top metal layer comprises: depositing a first insulation sub-layer above the top metal layer; depositing a conductor for constructing an electromagnetic coil on the first insulation sub-layer; and depositing a second insulation sub-layer on the electromagnetic coil, the first insulation sub-layer, the second insulation sub-layer and the conductor forming the insulation layer II; and the depositing a soft ferromagnetic alloy material layer above the insulation layer II comprises: depositing the soft ferromagnetic alloy material layer on the second insulation sub-layer.

* * * * *